United States Patent
Lai et al.

(10) Patent No.: US 6,835,964 B2
(45) Date of Patent: Dec. 28, 2004

(54) GAN-BASED COMPOSITION SEMICONDUCTOR LIGHT-EMITTING ELEMENT AND ITS WINDOW LAYER STRUCTURE

(76) Inventors: Mu-Jen Lai, No. 34, Industry East Rd. 4th, Science-Based Industrial Park, Hsinchu (TW); Chiung-Yu Chang, No. 34, Industry East Rd. 4th, Science-Based Industrial Park, Hsinchu (TW)

( * ) Notice: Subject to any disclaimer, the term of this patent is extended or adjusted under 35 U.S.C. 154(b) by 13 days.

(21) Appl. No.: 10/447,433

(22) Filed: May 28, 2003

(65) Prior Publication Data

US 2004/0238839 A1 Dec. 2, 2004

(51) Int. Cl.[7] .......................... H10L 27/15; H10L 33/00
(52) U.S. Cl. ............................ 257/99; 257/79; 257/94; 257/103
(58) Field of Search ................. 257/79–103; 372/43–50

(56) References Cited

U.S. PATENT DOCUMENTS 6,420,736 B1 * 7/2002 Chen et al. .................. 257/99
2003/0185265 A1 * 10/2003 Henrichs ..................... 372/96

* cited by examiner

*Primary Examiner*—Nathan J. Flynn
*Assistant Examiner*—Johannes Mondt
(74) *Attorney, Agent, or Firm*—Pro-Techtor International Services

(57) ABSTRACT

A GaN-based composition semiconductor light-emitting element and its window layer structure includes a substrate where several epitaxy layers are sequentially formed and a window layer formed on the epitaxy layers so as to construct a light-emitting element. Each of the epitaxy layers and the window layer is composed of GaN-based composition. Boron atoms are doped in the window layer so as to increase the band gap of the window layer and decrease the refractive index. By appropriately doping the boron atoms, the activity rate of the P-type will be increased so as to increase the electric conductivity. Furthermore, by increasing the thickness of the window layer, the probability of defect generation can be reduced.

10 Claims, 8 Drawing Sheets

GAN-BASED COMPOSITION SEMICONDUCTOR LIGHT-EMITTING ELEMENT AND ITS WINDOW LAYER STRUCTURE

BACKGROUND OF THE INVENTION

1. Field of the Invention

The present invention relates to a semiconductor light-emitting element, and particularly to a GaN light emitting diode having a high light-emitting efficiency by doping boron atoms in the window layer.

2. Description of the Prior Art

A light emitting diode (LED) is a photoelectric element made of semiconductor material. This element has two electrode terminals, and a voltage is exerted between the terminals and little current passes through them so as to emit light. In order words, the emitting principle of LED is to exert a voltage on the composition semiconductor made of AlGaAs, AlGaInP, and GaInN, all of which are belonged to III–V group, so that the electron will be combined with the electric hole and the excessive energy will be releases so as to emit light.

In order to achieve a high efficiency, the crystallization is promoted so as to increase the inside quantum efficiency, and in addition, the improvement of the light extraction technology and the light-emitting efficiency can increase the practical usage of the LED. In the prior art light emitting diode, the refraction coefficient of the GaN is 2.3, and the refraction coefficient of the air is 1.0. Therefore, the light emitted from the function layer of the diode is easily refracted and re-absorbed. This will make the light emitting efficiency of the light emitting diode poor. In order to improve the light emitting efficiency, a light emitting diode is developed to have a window layer, made of semiconductor material, for penetrating the light so that the light emitting efficiency can be increased. However, this will make the manufacture cost high and take much time for manufacture so that the price of the diode is very high.

Therefore, the present invention is provided to resolve the mentioned problems. By doping proper amount of borons in the material of the window layer of the GaN-based composition semiconductor light-emitting element, the refraction coefficient of the window layer can be reduced so that that refraction coefficient is more approaching the refraction coefficient of the air. Therefore, the re-absorption efficiency can be reduced so as to promote the light emitting efficiency of the GaN light emitting diode.

SUMMARY OF THE INVENTION

The main objective of the present invention is to provide a GaN-based composition semiconductor light-emitting element and its window layer structure. By appropriately doping borons in the window layer of the GaN light-emitting element, the activity rate of the P type doping will be increased so that the refraction coefficient of the window layer can be reduced so as to be more approaching to that of the air. Therefore, the refraction can be reduced and the light emitting efficiency will be promoted so as to overcome the problems of the prior art caused by the poor light emitting efficiency.

Another objective of the present invention is to provide a GaN-based composition semiconductor light-emitting element and its window layer structure. By increasing the thickness of the window layer, the light emitting efficiency of the light-emitting element will be increased and the generation probability of the defect will also be reduced.

In order to achieve the above objectives, the GaN-based composition semiconductor light-emitting element according to the present invention comprises a light-emitting epitaxy layer made of GaN-based composition, and a window layer formed on the light-emitting epitaxy layer. This window layer is made of GaN-based composition and is doped with boron atoms. The composition ratio of the boron atoms is lower than three-tenths in the GaN-based composition. Therefore, the refractive index of the window layer is lower than the refractive index of the light-emitting epitaxy layer.

According to the present invention, the window layer comprises a first window layer and a second window layer below the first window layer. The two window layers are made of $B_xAl_yGa_zN$, wherein $0 \leq x \leq 1$, $0 \leq Y \leq 1$, $0 \leq z \leq 1$, and $x+y+z=1$, where x is the composition ratio of boron. The first window layer is formed under a low temperature while the second window layer is formed under a high temperature. In addition, the first and second window layers also can be separately formed under high temperatures.

In order to achieve the mentioned objectives, the present invention provides a window layer structure for a GaN-based composition semiconductor light-emitting element. This window layer structure is formed on several epitaxy layers, and the window layer is made of GaN-based composition. Boron atoms are doped in the window layer and the composition ratio of the borons is lower than three-tenths in the GaN-based composition so that the refractive index of the window layer is lower than the refractive indexes of the epitaxy layers.

BRIEF DESCRIPTION OF THE DRAWINGS

The accompanying drawings, which are incorporated in and form part of the specification in which like numerals designate like parts, illustrate preferred embodiments of the present invention and together with the description, serve to explain the principles of the invention. In the drawings.

DETAILED DESCRIPTION OF THE PREFERRED EMBODIMENT

The present invention relates to a window layer for a GaN-based composition semiconductor light-emitting element. By doping proper amount of boron atoms in the window layer, the refraction coefficient of the window layer can be reduced so as to be more approaching to the refraction coefficient of the air. Therefore, the effect for refraction will be reduced when light is emitted.

Figure 1:
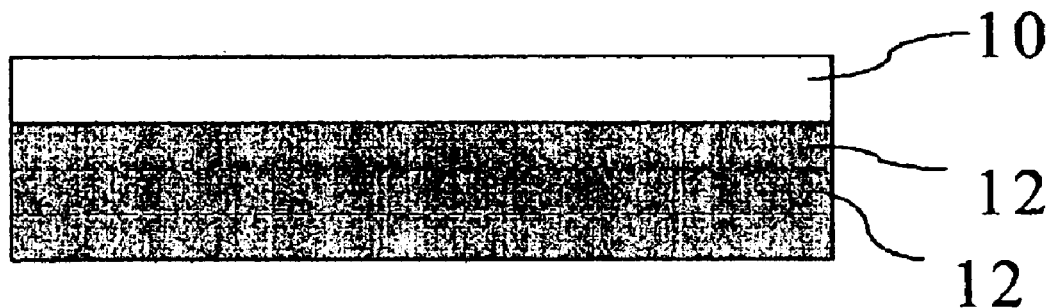
FIG. 1 is a perspective diagram of a window layer structure applied in a GaN-based composition semiconductor light-emitting element according to the present invention.

Please refer to FIG. 1. FIG. 1 is a perspective diagram of a window layer structure applied in a GaN-based composition semiconductor light-emitting element according to the present invention. This window layer 10 is formed on several epitaxy layers 12. The epitaxy layers 12 construct a light-emitting epitaxy layer. The window layer 10 and the epitaxy layers 12 are made of GaN-based compositions. The window layer 10 is doped with borons (B) so as to increase the band gap of the window layer 10 and reduce the refractive index. In addition, the activity rate for P type doping of the window layer 10 will be increased, and namely, the electric conductivity of the window layer 10 will also be increased.

The basic structure of the GaN-based composition light-emitting element is a PIN diode structure comprising a P type layer, an N type layer and an active layer between them. For the design of vertical structure, the structure of the PIN diode is mainly divided into a homo-junction (HOMO) structure, a single-heterostructure (SH) structure, a double-heterostructure (DH) structure, a single-quantum well (SQW) structure and a multiple quantum well (MQW) structure. The structure of the window layer 10 according to the present invention is not limited to the PIN diode. Because the activity layer of the multiple quantum well structure can be modulated so as to increase the light emitting efficiency and shorten the wave-length for the light-emitting, a GaN-based composition light-emitting element having a multiple quantum well structure is applied in the present invention. The window layer structure of the present invention will be described in following details, as well as the application for the window layer structure in an entire light-emitting element and the structure and manufacture process of the light-emitting element.

Figure 5:
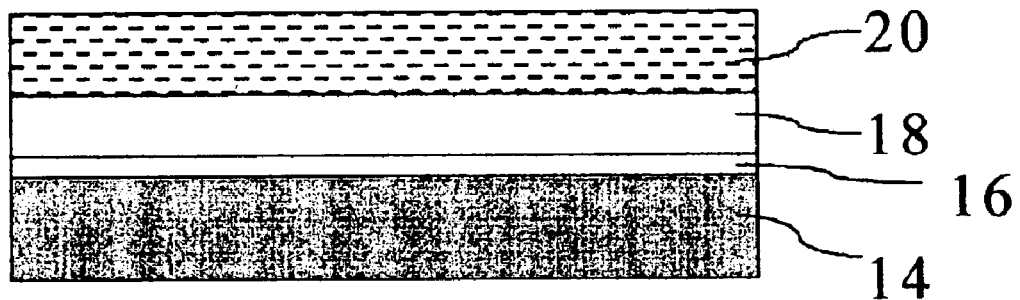
Figure 6:
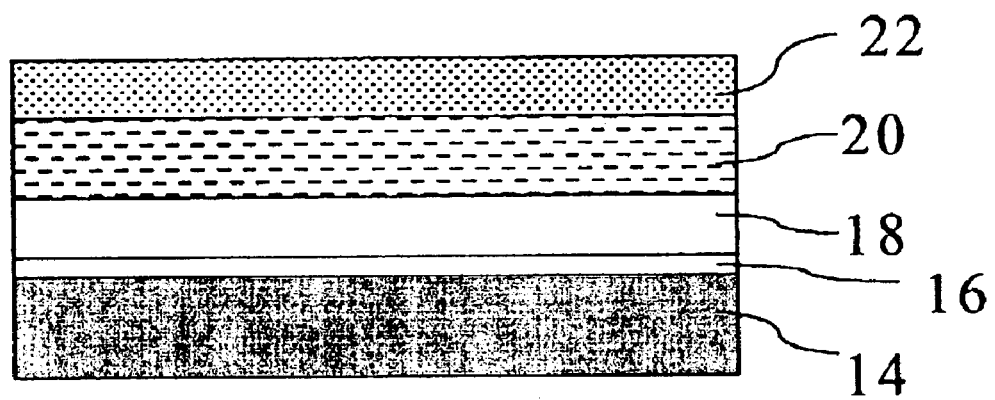
Figure 7:
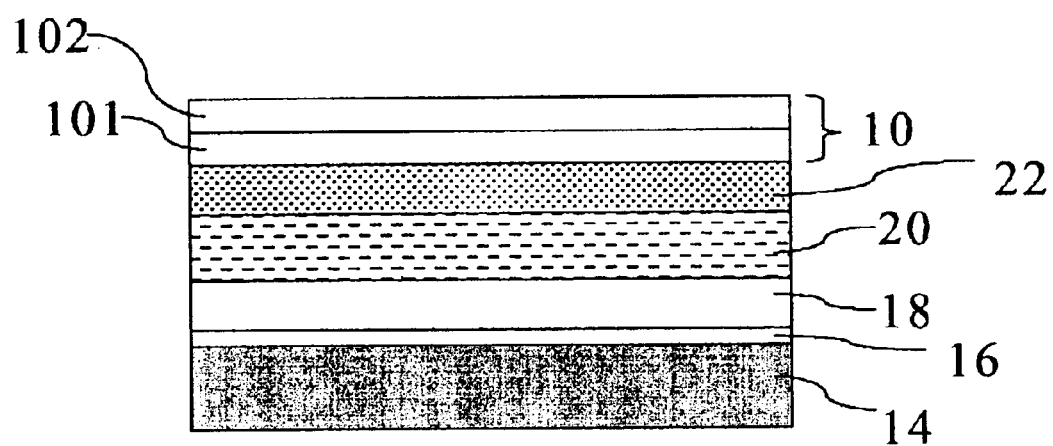

FIGS. 2 to 7 are sectional views of the epitaxy structures of the GaN-based composition semiconductor light-emitting element in different manufacturing steps. Please refer to FIG. 7. FIG. 7 is a perspective diagram of the inventive structure. The GaN-based composition light-emitting element according to the present invention comprises a substrate 14, and a low temperature buffer layer 16 and a high temperature buffer layer 18 sequentially formed on the substrate 14. A multiple quantum well structure layer 20, a P type GaN layer 22 and a window layer 10 of P type are sequentially formed on buffer layer 18 at a high temperature.

Figure 2:
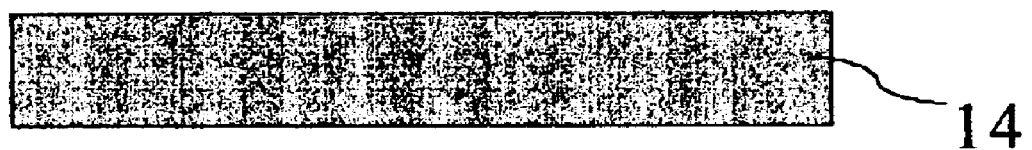
FIGS. 2 to 7 are sectional views of the structures of the GaN-based composition semiconductor light-emitting element in different manufacturing steps.
Figure 3:
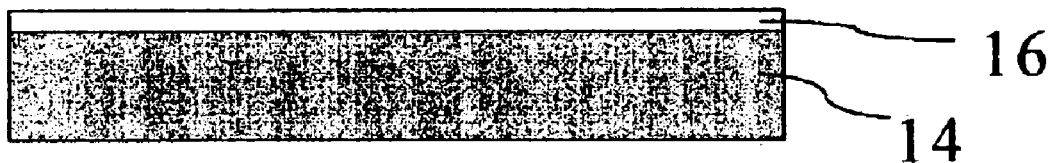
Figure 4:
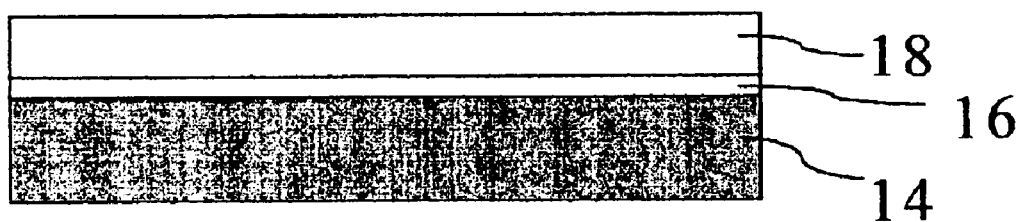

The structure and the manufacturing method for each of the layers of the inventive light-emitting element will be explained in detail by referring to FIG. 2 to FIG. 7. First, as shown in FIG. 2, a substrate 14, made of $Al_2O_3$ is provided. Next, as shown in FIG. 3, by employing a metal-organic chemical vapor deposition (MOCVD) method, the low temperature buffer layer 16 is produced from the epitaxy on the surface of the substrate 14 under a low temperature, and the temperature for the epitaxy is between 200° C. to 800° C. The range of 450° C. to 600° C. is often preferred. And as shown in FIG. 4, in the same manufacturing process, the high temperature buffer layer 18 is formed on the low temperature buffer layer 16 under a high temperature, and the temperature for epitaxy is between 800° C. to 1100° C. The preferred is about 1000° C. The low temperature and high temperature buffer layer 16, 18 are made of GaN-based composition, generally GaN. These two buffer layers 16, 18 are so formed that there is a better lattice matching between the following epitaxy layer and the substrate 14.

Based on different GaN-based composition semiconductors used for making the low temperature buffer layer 16 and the high temperature buffer layer 18, the MOCVD method is employed by using one of the groups composed of monomethyl hydrazine (MMH), trimethyl gallium (TMG), trimethy aluminum (TMAI), trimethy indium (TMIn) and $NH_3$. It is well known in the prior art to use MOCVD method, and therefore, it will not be described herein.

After forming the low temperature buffer layer 16 and the high temperature buffer layer 18 on the substrate 14, as shown in FIG. 5, a multiple quantum well structure layer 20 is formed on the high temperature buffer layer 18. The multiple quantum well structure layer 20 comprises an N type layer, an activity layer and a P type layer. By using the activity of the activity layer, the function for light emitting will be produced. After the multiple quantum well structure layer 20 is formed, as shown in FIG. 6, a P type GaN layer 22 is formed on the multiple quantum well structure layer 20, and it is made of GaN-based composition of P type. Please refer to FIG. 7, a window layer 10 of P type doping is formed on the P type GaN layer 22, and this window layer 10 is made of GaN-based composition where borons are doped so as to increase the activity rate of the P type.

Figure 8A:
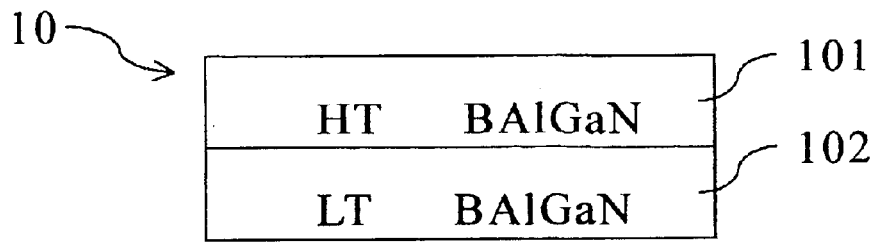
FIGS. 8(a) to 8(c) are perspective diagrams of the different structures of the window layer according to the embodiments of the present invention.
Figure 8B:
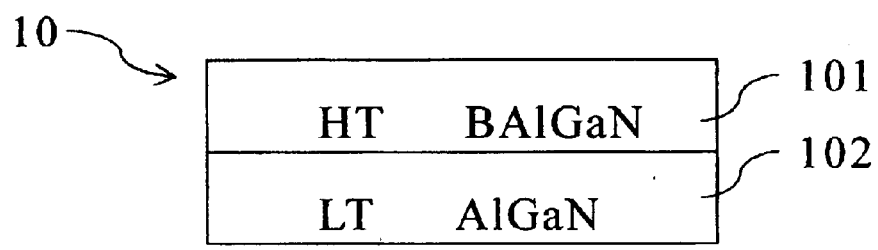
Figure 8C:
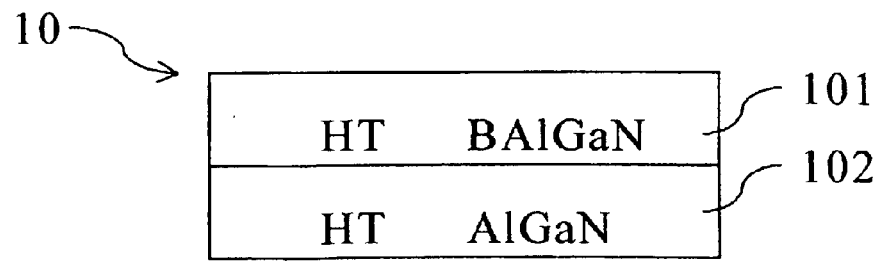

The structure of the window layer 10 comprises a first window layer 101 and a second window layer 102 formed below the first window layer 101. The first window layer 101 and the second window layer 102 are made of $B_xAl_yGa_zN$, and $0 \leq x \leq 1$, $0 \leq x \leq 1$, $0 \leq z \leq 1$, and $x+y+z=1$, where x is the composition ratio of boron. The first window layer 101 is formed under a low temperature while the second window layer 102 is formed under a high temperature. In addition, the first window layer 101 and the second window layer 102 also can be separately formed under high temperatures. FIG. 8(a) to 8(c) are perspective diagrams of the different structures of the window layer 10 according to the embodiments of the present invention. As shown in FIG. 8(a), the structure of the window layer 10 comprises a BAlGaN layer formed under a low temperature for being the first window layer 101, and a BAlGaN layer formed under a high temperature for being the second window layer 102. The structure of the window layer 10 also can comprise, as shown in FIG. 8(b), a AlGaN layer formed under a low temperature for being the first window layer 101 and a BAlGaN layer formed under a high temperature for being the second window layer 102. As shown in FIG. 8(c), the structure of the window layer 10 comprises a AlGaN layer formed under a high temperature for being the first window layer 101 and a BAlGaN layer formed under a high temperature for being the second window layer 102.

By doping boron atoms in the window layer 10 of the GaN-based composition light-emitting element, generally, the composition ratio of the borons is lower than three-tenths in the GaN-based composition so that the band gap of the window layer 10 can be increased and the refractive index of the window layer 10 can be reduced. Therefore, the refractive index of the window layer 10 is reduced from 2.3 for the prior art GaN to 2.0. Compared with the refraction coefficient for the prior art GaN, that of the window layer 10 is more approaching to the refraction coefficient of the air (about 1.0) so that the refraction for the light emitted from the activity layer will be reduced and the light emitting efficiency will be promoted. Besides, by doping a proper amount of the borons, the activity rate for the window layer 10 of P type can be increased so as to increase the electric conductivity.

On the other hand, by appropriately modulating the composition of the window layer 10 according to the present invention, the light emitting efficiency of the light-emitting element can be increased, and the probability for producing the defect can be reduced by increasing the thickness of the window layer so as to efficiently avoid the imperfection of the light-emitting element.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A GaN-based composition semiconductor light-emitting element comprising:

a light-emitting epitaxy layer made of GaN-based composition; and a window layer formed on said light-emitting epitaxy layer, said window layer being made of GaN based composition, and boron atoms being doped in said window layer, wherein the composition ratio of said boron atoms is lower than three-tenths in said GaN-based composition so that the refractive index of said window layer is lower than the refractive index of said light-emitting epitaxy layer.

2. The GaN-based composition semiconductor light-emitting element of claim 1, wherein said window layer comprises a first window layer and a second window layer below said first window layer.

3. The GaN-based composition semiconductor light-emitting element of claim 2, wherein said first window layer and said second window layer are made of $B_xAl_yGa_zN$, and $0 \leq x \leq 1$, $0 \leq Y \leq 1$, $0 \leq z \leq 1$, $x+y+z=1$, where x is the composition ratio of boron.

4. The GaN-based composition semiconductor light-emitting element of claim 2, wherein said first window layer is formed under a low temperature while said second window layer is formed under a high temperature.

5. The GaN-based composition semiconductor light-emitting element of claim 2, wherein said first window layer and said second window layer are separately formed under high temperatures.

6. A window layer structure for a GaN-based composition semiconductor light-emitting element, said window layer being formed on several epitaxy layers, and said window layer being made of GaN-based composition, wherein said boron atoms are doped in said window layer and the composition ratio of said boron atoms is lower than three-tenths in the GaN-based composition so that the refractive index of said window layer is lower than the refractive indexes of said epitaxy layers.

7. The window layer structure of claim 6, wherein said window layer comprises a first window layer and a second window layer below the first window layer.

8. The window layer structure of claim 7, wherein said first window layer and said second window layer are made of $B_xAl_yGa_zN$, and $0 \leq x \leq 1$, $0 \leq Y \leq 1$, $0 \leq z \leq 1$, $x+y+z=1$, where x is the composition ratio of boron.

9. The window layer structure of claim 7, wherein said first window layer is formed under a low temperature while said second window layer is formed under a high temperature.

10. The window layer structure of claim 7, wherein said first window layer and said second window layer are separately formed under high temperatures.

* * * * *